United States Patent [19]
Grigas

[11] Patent Number: 5,761,802
[45] Date of Patent: Jun. 9, 1998

[54] MULTI-LAYER ELECTRICAL INTERCONNECTION METHOD

[75] Inventor: Michelle A. Grigas, Marlboro, Mass.

[73] Assignee: Raytheon Company, Lexington, Mass.

[21] Appl. No.: 661,262

[22] Filed: Jun. 10, 1996

[51] Int. Cl.$^6$ ............................................. H01K 3/10
[52] U.S. Cl. .......................... 29/852; 29/830; 29/854; 29/846; 216/18; 216/20; 427/98
[58] Field of Search .................... 361/764, 792, 361/795; 216/6, 13, 11, 18, 20; 427/96, 98; 428/901; 438/125, 238, 662; 29/252, 830, 831, 838, 846, 847, 848, 854, 620

[56] References Cited

U.S. PATENT DOCUMENTS

| | | | |
|---|---|---|---|
| 5,022,960 | 6/1991 | Takeyama et al. | 29/852 |
| 5,363,550 | 11/1994 | Aitken et al. | 29/852 |
| 5,526,564 | 6/1996 | Ohshima et al. | 29/852 |

Primary Examiner—W. Donald Bray
Attorney, Agent, or Firm—Fish & Richardson P.C.

[57] ABSTRACT

A method for electrically interconnecting a first electrical conductor to a second electrical conductor through a via formed in an insulating layer disposed between the conductors. A refractory metal layer is formed over: an upper surface of the insulating layer; sidewalls of the insulating layer formed by the via; and, portions of the first electrical conductor exposed by the via. Gold is deposited on a portion of the refractory metal layer formed on the exposed portion of the first electrical conductor. The deposited gold has a planar surface and is preferably spaced from portions of the conductive layer disposed on the sidewalls of the insulating layer to provide an plating site. Additional gold is electroplated onto the electroplating site to fill the via to a level co-planar with the upper level of the insulating layer. A photoresist layer is formed over the co-planar surfaces of the insulating layer and the filled via. An opening is formed in the photoresist layer exposing a portion of the surface of the filled via. A conductive material is deposited onto the photoresist layer and through the opening onto the exposed portion of the surface of the filled via. The photoresist with the portions of the conductive material deposited thereon is lifted-off while leaving the portion of such conductive material deposited onto the exposed portion of the surface of the filled via.

11 Claims, 4 Drawing Sheets

MULTI-LAYER ELECTRICAL INTERCONNECTION METHOD

BACKGROUND OF THE INVENTION

This invention relates generally to multi-layer electrical interconnection methods and more particularly to methods for electrically connecting a pair of conductors using vias through an insulating layer disposed between the conductors.

As is known in the art, multi-layer interconnect technology has been used widely in high density integrated circuits for applications ranging from silicon-based very large scale integrated (VLSI) circuits to GaAs-based microwave and millimeter wave integrated circuits (MMICs). In multi-layer interconnect technology, a large number of electronic components are fabricated on multiple dielectric (i.e., insulating) layers to reduce chip area while providing full circuit functions. A via interconnect technology is typically used to electrically interconnect the multi-layer components. More particularly, a via is provided through the dielectric layer and an electrical interconnect passes through via to make the electrical interconnection between the multi-level components.

As is also known in the art, typical via technology for silicon-based multi-level interconnects utilize a fabrication process that involves selective metal deposition. More particularly, tungsten is chemically vapor deposited through into the via; such arrangement is, however, relatively expensive because it requires the use of chemical vapor deposition reactors. With GaAs-based via interconnect technology, metal plating and etch-back processing is typically used to provide the interconnect through the via.

More particularly, with an etch-back process, a metal layer is deposited over the surface of the dielectric layer, over the sidewalls of the dielectric layer formed by the via, and onto the portion of an electrical contact exposed by the via. To pattern the metal layer into a desired conductor, the metal layer is covered with a positive photoresist layer. A mask is then placed over the portions of the photoresist layer where the metal layer is to be patterned into the desired electrical conductor. The surface of the photoresist layer is exposed to light to polymerize the portions thereof exposed by the light; the portions of the photoresist layer masked from the light by the mask remaining non-polymerized. The mask is removed. The polymerized portions of the photoresist layer is removed. The portions of the metal layer exposed by the remaining portions of the photoresist layer are then removed (i.e., etched back) to pattern the metal layer into the desired conductor. While such etch-back process is useful in many applications, it may not be used practically in those applications requiring narrow conductors.

Another technique used to pattern conductors is a lift-off process. Here, a negative acting photoresist layer is formed over the surface onto which the conductor is to be formed. A mask is placed over the surface portions of the negative acting photoresist layer where the conductor is to be formed. The masked surface of the photoresist is exposed to light to again polymerize the un-masked portions of the photoresist. The mask is removed leaving an opening in the photoresist layer. The portions of the photoresist layer not exposed by the light are removed. A metal is then deposited over the surface of the remaining photoresist layer and through the opening onto the surface portions exposed by the opening. The photoresist layer with the portions of the metal layer deposited thereon are removed, the remaining metal providing the desired conductor pattern. While this lift-off process enables patterning of conductors having narrower widths then that achievable with the etch-back process, to achieve these narrow widths with the lift-off process requires that the photoresist be formed on a planar surface. Therefore, using the etch-back process in forming a conductor which passes over the via limits the accuracy and minimum width achievable otherwise achievable with a lift-off process.

SUMMARY OF THE INVENTION

In accordance with the present invention, a method is provided for electrically interconnecting a first electrical conductor to a second electrical conductor through a via formed in an insulating layer disposed between the conductors. A conductive material is formed on a portion of the first electrical conductor exposed by the via to provide an plating site. The plating site has a planar surface. In a preferred embodiment, the plating site is spaced from sidewalls of the insulating layer formed by the via. Additional conductive material is selectively plated onto the plating site to fill the via to provide, over the filled via, a surface co-planar with an upper surface of the insulating layer.

With such an arrangement, because the additional material is plated selectively onto the plating site and not onto the sidewalls, as additional material is plated uniformly over the site, a planar surface is provided for subsequent lift-off patterning of conductors which pass over the via.

More particularly, in accordance with another feature of the invention, the method includes the step of: forming a photoresist layer over the co-planar surfaces of the insulating layer and the filled via; forming an opening in the photoresist layer exposing a portion of the surface of the filled via; depositing a conductive material onto the photoresist layer and through the opening onto the exposed portion of the surface of the filled via; and lifting-off the photoresist with the portions of the conductive material deposited thereon while leaving the portion of such conductive material deposited onto the exposed portion of the surface of the filled via.

In a preferred embodiment of the invention, a method is provided for electrically interconnecting a first electrical conductor to a second electrical conductor through a via formed in an insulating layer disposed between the conductors. A refractory metal layer is formed over: an upper surface of the insulating layer; sidewalls of the insulating layer formed by the via; and, portions of the first electrical conductor exposed by the via. Gold is deposited on a portion of the refractory metal layer formed on the exposed portion of the first electrical conductor. The deposited gold is spaced from portions of the conductive layer disposed on the sidewalls of the insulating layer to provide an electroplating site with a planar surface. Additional gold is electroplated onto the electroplating site to fill the via to a level co-planar with the upper level of the insulating layer. A photoresist layer is formed over the co-planar surfaces of the insulating layer and the filled via. An opening is formed in the photoresist layer exposing a portion of the surface of the filled via. A conductive material is deposited onto the photoresist layer and through the opening onto the exposed portion of the surface of the filled via. The photoresist with the portions of the conductive material deposited thereon is lifted-off while leaving the portion of such conductive material deposited onto the exposed portion of the surface of the filled via.

BRIEF DESCRIPTION OF THE DRAWING

Other features of the invention, as well as the invention itself, will become more readily apparent from the following detailed description when read together with the accompanying drawings, in which.

DESCRIPTION OF THE PREFERRED EMBODIMENTS

Figure 1A:
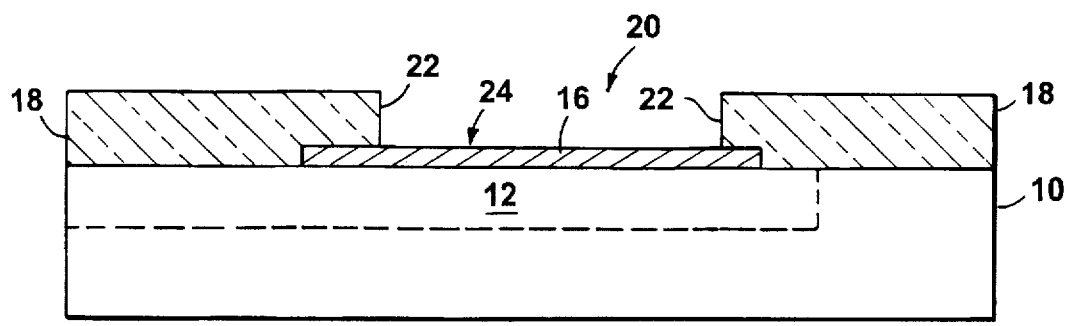
FIGS. 1A through 1I are diagrammatical cross-sectional elevation views of a multi-level interconnect system according to the invention at various stages in the fabrication thereof.

Referring now to FIG. 1A, a semiconductor body 10, here gallium arsenide, is shown having a field effect transistor 12 formed in a region thereof. The field effect transistor 12 has an electrical contact 16, here for example, a source contact 16, here gold. An insulating layer 18, here a polyimide having a thickness in the range of 5 to 20 microns is deposited over the surface of the semiconductor body 10 and over the contact 16. The insulating layer 18 is then photo-lithographically processed (i.e., developed) to have a via 20 formed therein. The via 20 here has a diameter of 30 to 50 microns. The via 20 provides sidewalls 22 in the insulating layer 18, as shown. The via 20 is positioned to exposed a surface portion 24 of the contact 16, as shown.

Figure 1B:
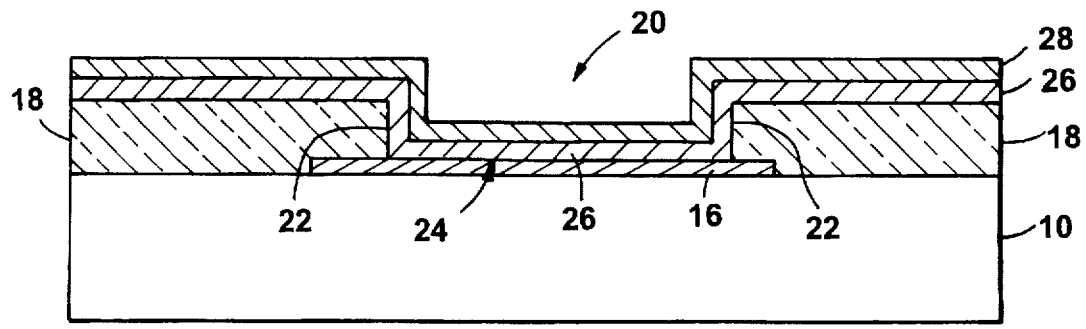

Referring now to FIG. 1B, a refractory metal layer 26, here titanium, is deposited, here sputter deposited, over the surface of the insulating layer 18, over the sidewalls 22 and onto the exposed portion 24 of the contact 16. Here, titanium layer 26 has a thickness of 500 Å. Next, a layer 28 of gold is deposited, here evaporated, over the titanium layer 26, as shown. Here, the gold layer 28 has a thickness of 5000 Å.

Figure 1C:
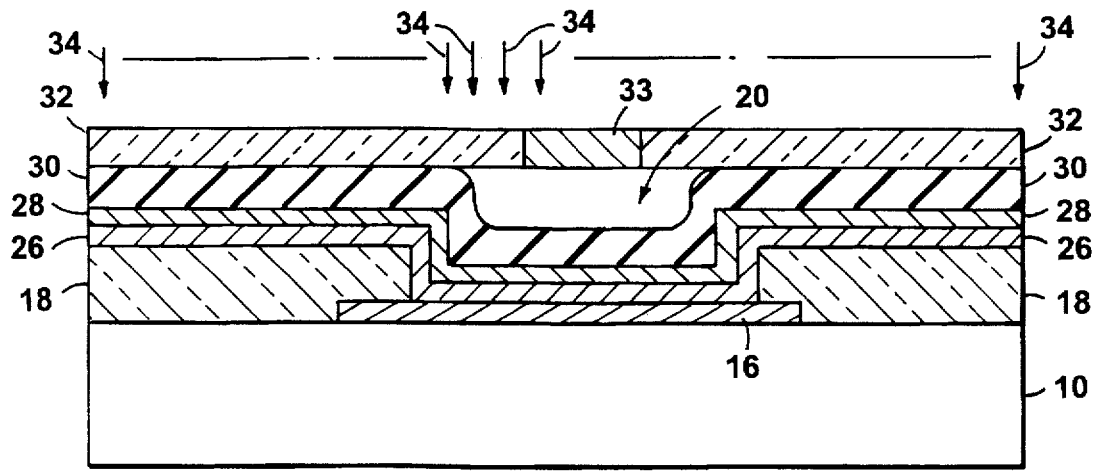

Next, a positive photoresist layer 30 is deposited, here spun, over the surface of the structure shown in FIG. 1C. The opaque, or light blocking region 33 of a glass mask 32, is placed over a portion of the photoresist layer 30, as shown in FIG. 1C. For reasons to become apparent hereinafter in connection with FIG. 1E, the mask 32 is placed over a portion of the gold layer 28 which is to provide a plating site. Suffice it to say here, however, that after the mask 34 has been properly placed over the photoresist layer 30, the masked layer 30 is exposed to light represented by arrows 34, as shown in FIG. 1C. The light polymerizes the un-masked portion of the positive photoresist layer 30; the portions of the photoresist layer 30 masked by mask 32 remaining un-polymerized.

Figure 1D:
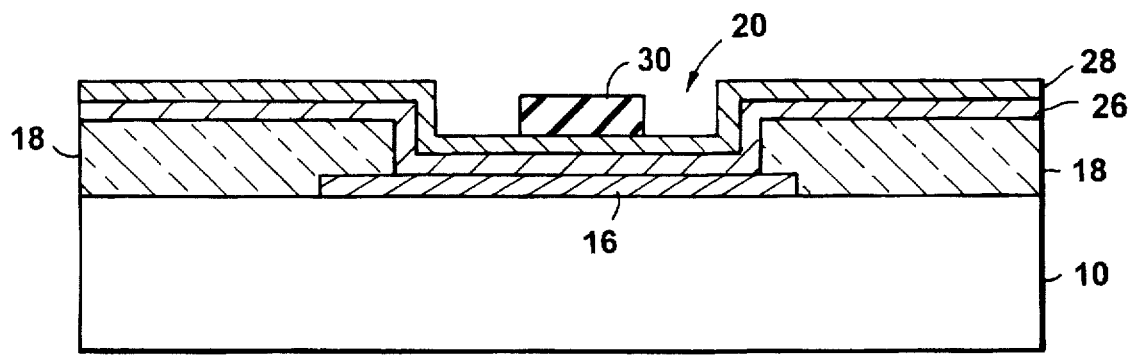
Figure 1E:
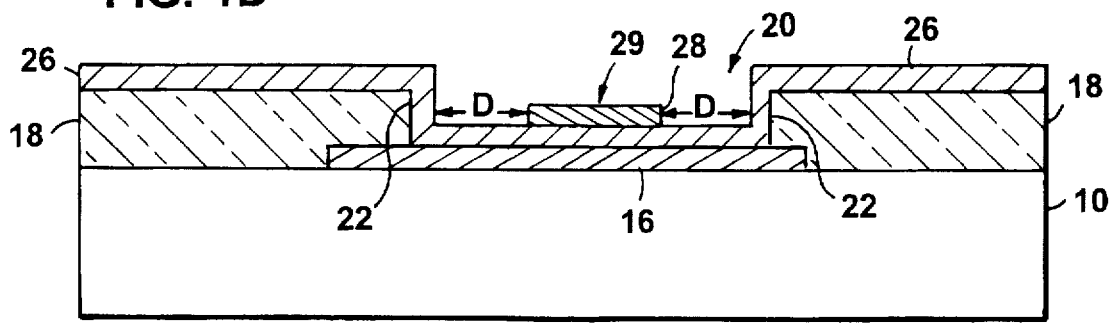
Figure 1F:
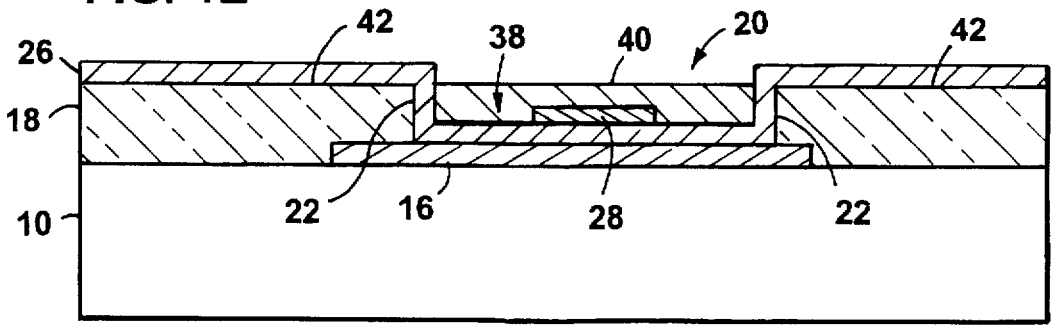

The mask 34 and polymerized portions of the photoresist layer 30 are removed to produce the structure shown in FIG. 1D. The structure is then subjected to potassium iodide (KI) to remove portions of the gold layer 28 exposed by the remaining portion of the photoresist layer 30. Thus, the portion of the gold layer 28 disposed under the remaining portion of the photoresist layer 30 remains to provide a plating site to be described. The resulting structure is shown in FIG. 1E. It is noted that the portion of the gold layer 28 remaining has a planar surface 29 and is spaced from the portion of the titanium layer 26 on the sidewalls 22 a distance, D, here 3 microns, as shown in FIG. 1E. The structure is next placed in an electroplating bath, not shown, having a gold solution. The gold layer 28 is plated with additional gold 38 for a period of time such that at the end of the plating process the via 20 is filled and the additional gold provides a surface 40 co-planar with the upper surface 42 of the insulating layer 18, as shown in FIG. 1F. It is noted that the gold layer 28 in FIGS. 1E and 1F acts as a plating site upon which the additional gold build-ups uniformly during the plating process. It is noted that the additional gold added by the plating process will not plate onto the titanium layer 26. Thus, the additional gold is selectively plated onto the plating site provided by the gold layer 28 in FIGS. 1E and 1F. That is, because the gold layer 28 has been removed from the sidewalls 22, the additional gold added by the plating process will not build-up on the sidewalls 22 in a way which results in a non-planar surface over the via.

Figure 2:
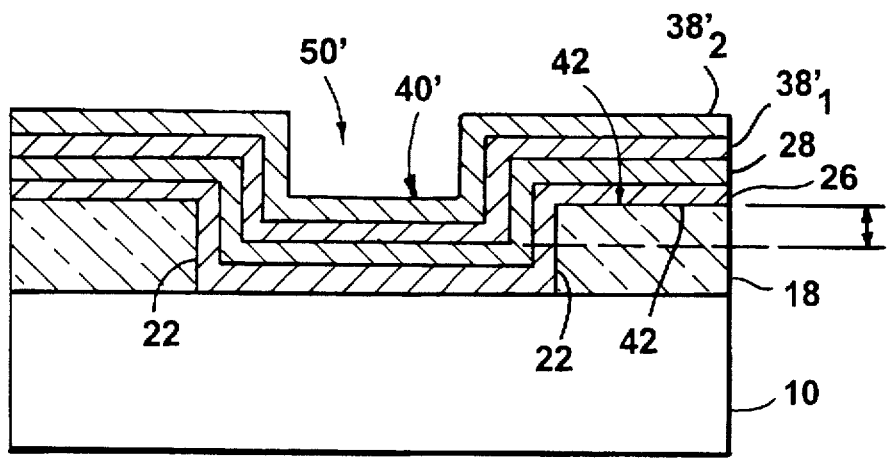
FIGS. 2 and 3 are diagrammatical cross-sectional elevation views of a multi-level interconnect system showing the effect of plating to fill a via when material is plated onto sidewalls of the via.

More particularly, referring to FIG. 2, a structure is shown where the gold layer 28 has not been patterned as described above in connection with FIG. 1E. Thus, in FIG. 2, the gold layer 28 remains on the sidewalls 22, as well as on the upper surface of the titanium layer 26, as shown. The electroplating step adds additional gold $38_1$, $38_2$, uniformly over all of the gold layer 28, as shown. Thus, when the surface 40' of the additional gold 38' filling the via the surface 40' reaches the same height as the upper surface 42 of the insulating layer 18, the surface over the via will not be co-planar with the upper surface of the insulating layer 18.

Figure 3:
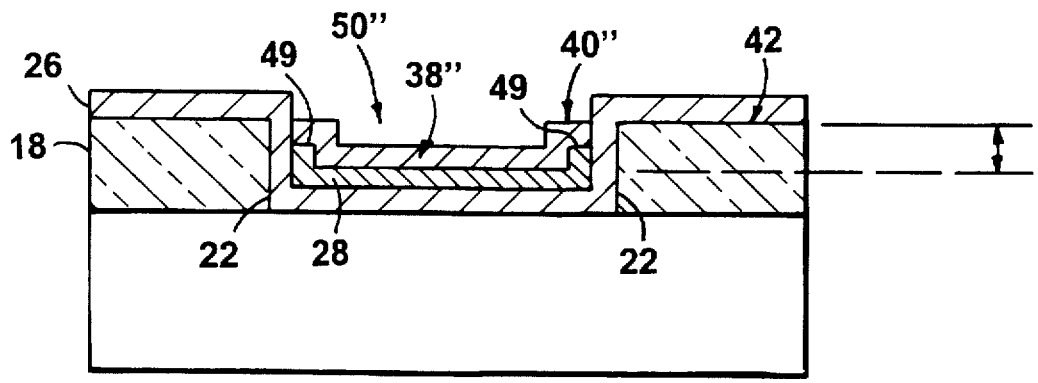

Referring to FIG. 3, a structure is shown where portions of the gold layer 28 remain on the sidewalls 22, i.e., the plating site provided by gold layer 28 is not spaced from the portion of the titanium layer 22 on the sidewalls 22. Again, as additional gold 38" is added by electroplating, when a surface 40" of the additional gold 38" reaches the level of surface 42 of the insulating layer 18, the surface over the via will not be co-planar with the upper surface of the insulating layer 18. Thus, the non-planar surface results because of the step 49 formed in the gold layer 28 as it rises on the portion of the titanium layer 26 deposited on the sidewall 22. It is noted that if the gold layer 28 terminated to substantial abut the titanium layer 22 the plating site would not have the step 49 and the filled via would have a planar surface when it reaches the level of the surface 42 of the insulating layer 18. Thus, with the planar upper surface 29 of the gold layer 28 the additional gold 38 added by plating provides a surface over the via which is co-planar with the upper surface 42 of the insulating layer 18.

Figure 1G:
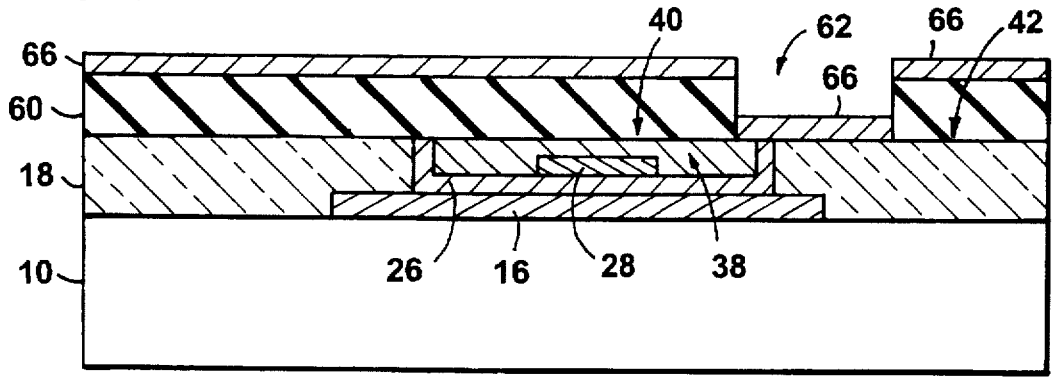
Figure 1H:
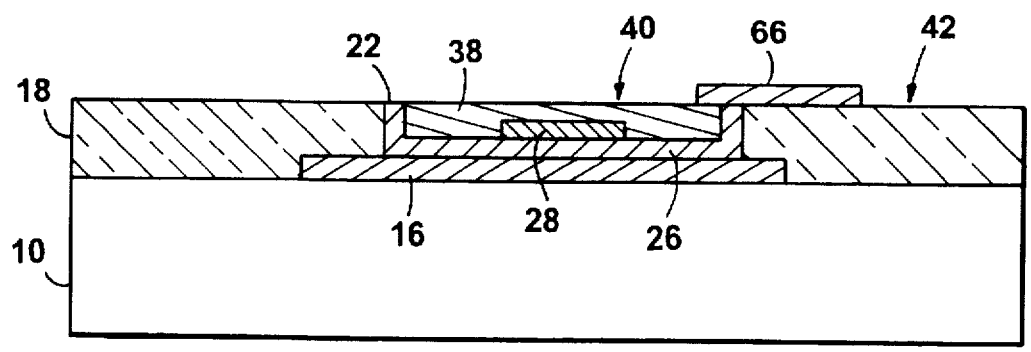

Next, the titanium layer 26 is etched away with a 10% hydrofluoric acid (HF)-90% distilled water solution. Referring now to FIG. 1G, a negative acting photoresist layer 60 is then deposited over the surface of the structure. The photoresist layer 60 is provided with an opening 62, as shown in FIG. 1G, using image reversal photolithography processes. A composite layer 66, here having a first layer of titanium 400 Å and a second layer of 3 microns gold are evaporated over the surface of the photoresist layer 60 and onto portions of the structure exposed by the opening 62. More particularly, the opening 62 is formed to expose a portion of the additional gold 38 used to fill the via, as shown. Here, the remaining portion of layer 66 extends over the additional gold 38 by a distance of one micron.

Next, the photoresist layer 60, with the portions of the layer 66 disposed thereon, are lifted-off; the portion of the layer 66 disposed on the co-planar surface 40 of the additional gold 38 and the surface 42 of the insulating layer 18 remaining, as shown.

Figure 1I:
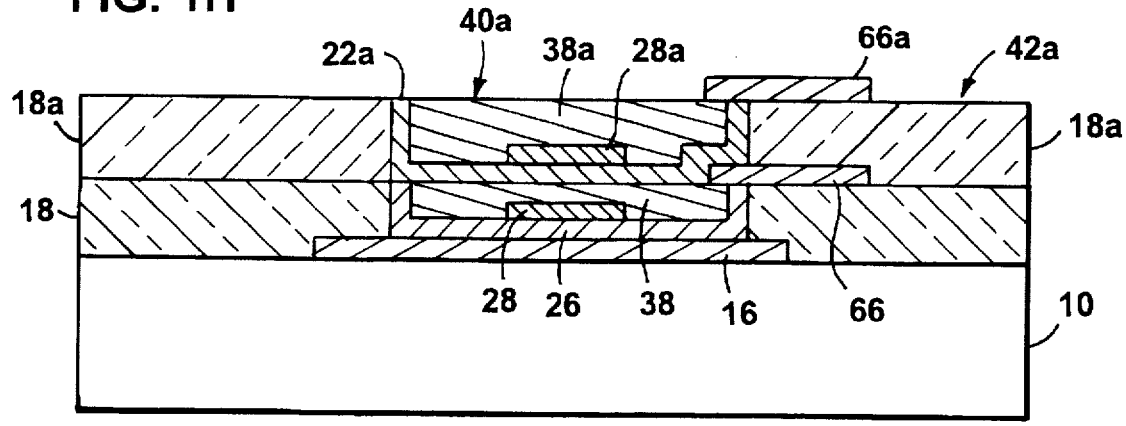

The process described in connection with FIGS. 1A through 1H are repeated to provide the structure shown in FIG. 1I. Thus, a second insulating layer 18a, titanium layer 22a, gold layer 28a (i.e. plating site) are formed. Additional gold 38a is plated onto the gold plating site 28a to fill the via formed though the second insulating layer 18a, as shown. A second layer 66a is patterned over the co-planar surface 40a and 42a using the lift-off process described above in connection with FIGS. 1G and 1H.

Thus, a multi-level electrical interconnection method and system are provided for electrically connecting conductors 66, 66a formed over a via using lift-off processing.

Other embodiments are within the spirit and scope of the appended claims.

What is claimed is:

1. A method for electrically interconnecting a first electrical conductor to a second electrical conductor through a via formed in an insulating layer disposed between the conductors, such method comprising the steps of:

forming a conductive material on a portion of the first electrical conductor exposed by the via, such conductive material having a planar surface;

plating additional conductive material onto the conductive material to fill the via and provide, over the filled via, a surface co-planar with an upper surface of the insulating layer.

2. The method recited in claim 1 including the step of:

forming a photoresist layer over the co-planar surfaces of the insulating layer and the filled via;

forming an opening in the photoresist layer exposing a portion of the surface of the filled via;

depositing a conductive material onto the photoresist layer and through the opening onto the exposed portion of the surface of the filled via; and lifting-off the photoresist with the portions of the conductive material deposited thereon while leaving the portion of such conductive material deposited onto the exposed portion of the surface of the filled via.

3. The method recited in claim 2 wherein the conductive material is spaced from sidewalls of the insulating layer formed by the via.

4. A method for electrically interconnecting a first electrical conductor to a second electrical conductor through a via formed in an insulating layer disposed between the conductors, such method comprising the steps of:

forming a conductive layer over: an upper surface of the insulating layer; sidewalls of the insulating layer formed by the via; and, portions of the first electrical conductor exposed by the via;

forming a conductive material different from the conductive layer on a portion of the conductive layer formed on the exposed portion of the first electrical conductor, such conductive material being spaced from portions of the conductive layer disposed on the sidewalls of the insulating layer, such conductive material providing an electroplating site;

plating additional conductive material onto the electroplating site to fill the via to a level co-planar with the upper level of the insulating layer.

5. The method recited in claim 4 including the step of:

forming a photoresist layer over the co-planar surfaces of the insulating layer and the filled via;

forming an opening in the photoresist layer exposing a portion of the surface of the filled via;

depositing a conductive material onto the photoresist layer and through the opening onto the exposed portion of the surface of the filled via; and lifting-off the photoresist with the portions of the conductive material deposited thereon while leaving the portion of such conductive material deposited onto the exposed portion of the surface of the filled via.

6. A method for electrically interconnecting a first electrical conductor to a second electrical conductor through a via formed in an insulating layer disposed between the conductors, such method comprising the steps of:

forming a first conductive layer over: an upper surface of the insulating layer; sidewalls of the insulating layer formed by the via; and, portions of the first electrical conductor exposed by the via;

forming a second conductive layer over the first conductive layer, such second conductive layer being of a material different from the conductive layer on a portion of the first conductive layer;

selectively removing portions of the second conductive layer formed over: portions of the first conductive layer formed on the upper surface of the insulating layer; and, the sidewalls, while leaving a portion of the formed second conductive layer spaced from portions of the first conductive layer disposed on the sidewalls of the insulating layer, such left portion of the second conductive material providing an electroplating site;

plating additional conductive material onto the electroplating site to fill the via to a level co-planar with the upper level of the insulating layer.

7. The method recited in claim 6 including the step of:

forming a photoresist layer over the co-planar surfaces of the insulating layer and the filled via;

forming an opening in the photoresist layer exposing a portion of the surface of the filled via;

depositing a conductive material onto the photoresist layer and through the opening onto the exposed portion of the surface of the filled via; and lifting-off the photoresist with the portions of the conductive material deposited thereon while leaving the portion of such conductive material deposited onto the exposed portion of the surface of the filled via.

8. The method recited in claim 7 wherein the first conductive layer is a refractory material.

9. The method recited in claim 8 wherein the refractory metal is titanium.

10. The method recited in claim 9 wherein the second conductive layer is gold.

11. The method recited in claim 9 wherein the insulating layer has a thickness in the order of 5 to 20 microns.

* * * * *